United States Patent
Shen et al.

(10) Patent No.: US 8,467,222 B2
(45) Date of Patent: Jun. 18, 2013

(54) READER FOR MAGNETIC SHIFT REGISTER

(75) Inventors: Kuei-Hung Shen, Hsinchu (TW); Ching-Hsiang Tsai, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/284,970

(22) Filed: Oct. 30, 2011

(65) Prior Publication Data

US 2013/0033917 A1 Feb. 7, 2013

(30) Foreign Application Priority Data

Aug. 2, 2011 (TW) .................................. 100127425

(51) Int. Cl.
*G11C 19/00* (2006.01)
(52) U.S. Cl.
USPC .......................................................... 365/80
(58) Field of Classification Search
None
See application file for complete search history.

(56) References Cited

U.S. PATENT DOCUMENTS

| | | | |
|---|---|---|---|
| 7,710,757 B2 | 5/2010 | Kim et al. | |
| 7,796,415 B2 | 9/2010 | Lee et al. | |
| 7,813,202 B2 | 10/2010 | Rodmacq et al. | |
| 2006/0114620 A1 | 6/2006 | Sbiaa et al. | |
| 2009/0040883 A1* | 2/2009 | Kim et al. | 369/13.41 |
| 2010/0073984 A1* | 3/2010 | Xi et al. | 365/80 |
| 2010/0237449 A1 | 9/2010 | Fukami et al. | |

FOREIGN PATENT DOCUMENTS

| | | |
|---|---|---|
| TW | 200935415 | 8/2009 |
| TW | 201042758 | 12/2010 |
| TW | 201101300 | 1/2011 |

OTHER PUBLICATIONS

Fukami et al., "Low-Current Perpendicular Domain Wall Motion Cell for Scalable High-Speed MRAM," Symposium on VLSI Technology Digest of Technical Papers, 2009, p. 230-231.
Hayashi et al., "Current-Controlled Magnetic Domain-Wall Nanowire Shift Register," Science, vol. 320, Apr. 11, 2008, p. 209-211.
Parkin et al., "Magnetic Domain-Wall Racetrack Memory," Science, vol. 320, Apr. 11, 2008, p. 190-194.
Fukami et al., "Current-induced domain wall motion in perpendicularly magnetized CoFeB nanowire," Applied Physics Letters 98, 2011, p. 082504-1-082504-3.

* cited by examiner

*Primary Examiner* — Hoai V Ho
*Assistant Examiner* — James G Norman
(74) *Attorney, Agent, or Firm* — Jianq Chyun IP Office

(57) ABSTRACT

A reader for magnetic shift register is provided. The reader includes a magnetic reference layer, a tunneling layer, a magnetic canceling layer and an isolated layer. The magnetic reference layer and the magnetic canceling layer are respectively configured at different sides of a magnetic track for providing anti-parallel magnetic fields. The magnetic reference layer overlaps the magnetic canceling layer in a perpendicular direction of the magnetic track. The magnetic reference layer electrically connects to a readout circuit. The magnetic canceling layer is floating. The tunneling layer is configured between the magnetic reference layer and the magnetic track for providing a magnetic tunnel junction (MTJ). The isolated layer is configured between the magnetic canceling layer and the magnetic track for avoiding a current in the magnetic track from tunneling to the magnetic canceling layer.

5 Claims, 5 Drawing Sheets

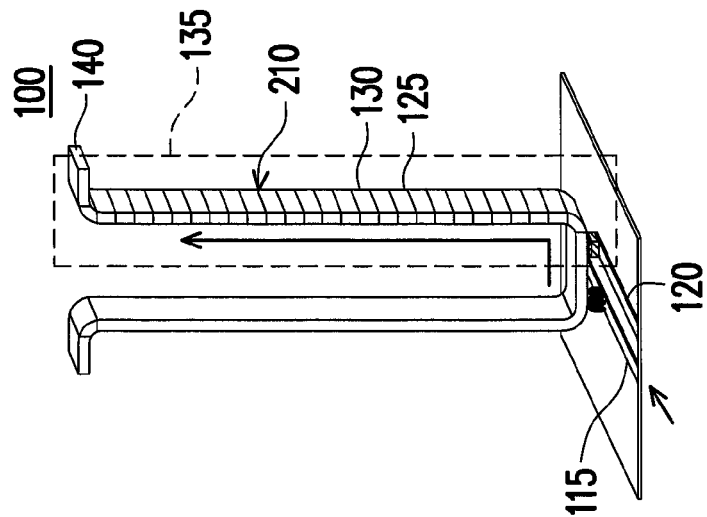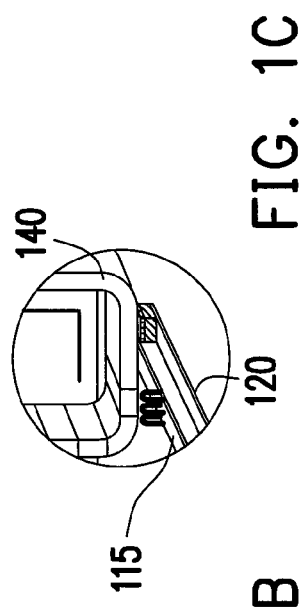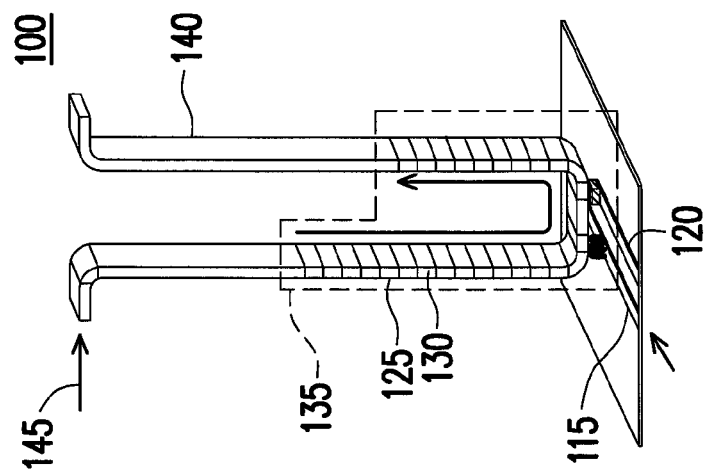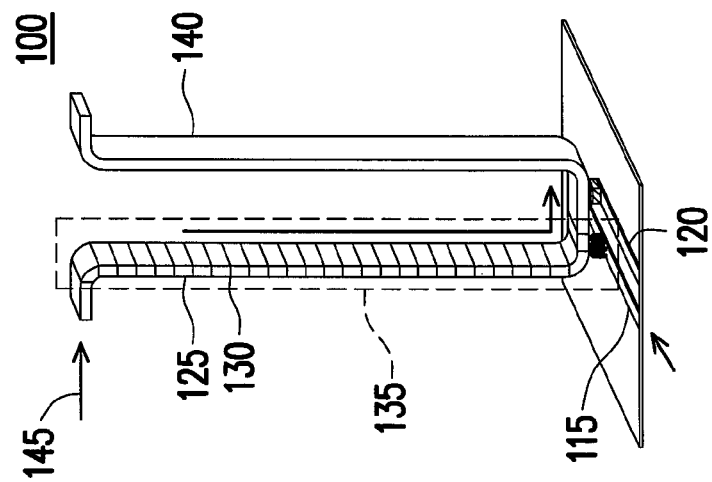
FIG. 1A  FIG. 1B  FIG. 1C

READER FOR MAGNETIC SHIFT REGISTER

CROSS-REFERENCE TO RELATED APPLICATION

This application claims the priority benefit of Taiwan application serial no. 100127425, filed on Aug. 2, 2011. The entirety of the above-mentioned patent application is hereby incorporated by reference herein and made a part of this specification.

BACKGROUND

1. Technical Field

The disclosure relates to a magnetic memory. Particularly, the disclosure relates to a reader for a magnetic shift register.

2. Related Art

Presently, a hard disk drive (HDD) is a non-volatile storage device having a largest capacity, though mechanical operations are required for moving a magnetic domain and reading/writing data stored in the magnetic domain, so that a reading/writing speed thereof is very slow. A magnetic memory without mechanical operation is totally driven by current or voltage, so that a reading/writing speed thereof can be greatly improved to expand its application range. As related theories and experiments of current-driven domain wall motion are successively proposed, a magnetic shift register memory now has higher possibility in implementation. Presently, the magnetic shift register can be integrated into a silicon chip, which is referred to as "HDD on a chip". Such type of memory has a chance for replacing the currently-used dynamic random access memory (DRAM), static random access memory (SRAM) and flash memory.

SUMMARY

An embodiment of the disclosure provides a reader for a magnetic shift register. The reader includes a magnetic reference layer, a tunnelling layer, a magnetic cancelling layer and an isolated layer. The magnetic reference layer is disposed at a first side of a magnetic track of the magnetic shift register for providing a first magnetic field having a first direction to the magnetic track. The magnetic reference layer is electrically connected to a readout circuit. The tunnelling layer is disposed between the magnetic reference layer and the magnetic track. The tunnelling layer provides magnetic tunnel junction (MTJ) between the magnetic reference layer and the magnetic track. The magnetic cancelling layer is disposed at a second side of the magnetic track. The magnetic cancelling layer partially or completely overlaps the magnetic reference layer in a perpendicular direction of the magnetic track. The magnetic cancelling layer provides a second magnetic field having a second direction to the magnetic track, where the second direction is different to the first direction, and the magnetic cancelling layer is floating. The isolated layer is disposed between the magnetic cancelling layer and the magnetic track for blocking a current in the magnetic track from tunnelling to the magnetic cancelling layer.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIGS. 1A-1C are schematic diagrams illustrating operation examples of a magnetic shift register.

DETAILED DESCRIPTION OF DISCLOSED EMBODIMENTS

Figure 2A:
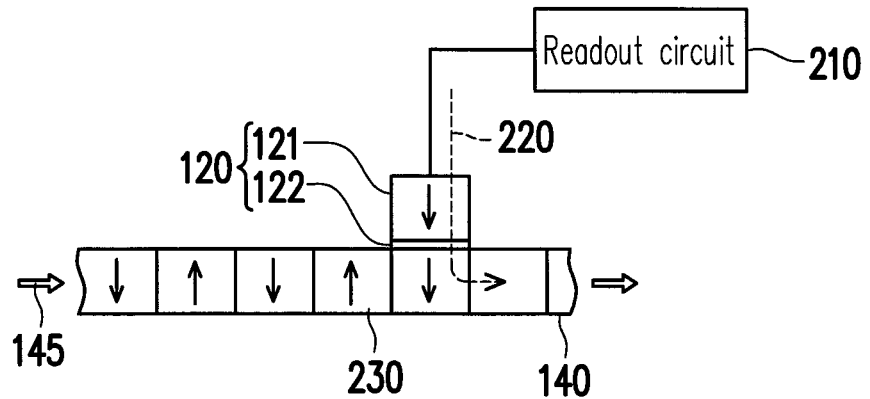
FIGS. 2A-2B are schematic diagrams illustrating operation examples of a reader of FIGS. 1A-1C.

The disclosure is a reader for a magnetic shift register, which reduces an influence of a first magnetic field of a magnetic reference layer on domain wall motion in a magnetic track.

The reader of the disclosure uses a reversed magnetic moment of the second magnetic field to cancel the first magnetic field of the magnetic reference layer, by which an influence of the first magnetic field of the magnetic reference layer on the domain wall motion in the magnetic track is reduced.

FIGS. 1A-1C are schematic diagrams illustrating operation examples of a magnetic shift register 100. The magnetic shift register 100 includes a magnetic track 140, a writing device 115 and a reader 120. The magnetic track 140 is made of a magnetic metal material or a ferromagnetic material, for example, an in-plane magnetic anisotropy (IMA) material such as NiFe, CoFe and CoFeB, etc., or a perpendicular magnetic anisotropy (PMA) material such as a multi-layer material of (Co/Ni)x, (Co/Pt)x and (Co/Pd)x, etc., or an alloy of CoPt, CoPd, FePt, CO and CoFeB, etc., or a PMA alloy formed by rare-earth such as TbFeCo, etc. and a transition metal, or a PMA composite magnetic layer composed of all of the aforementioned PMA materials and the IMA materials such as CoFe, Co, CoFeB, NiFe, etc. The magnetic track 140 can serve as a bit reservoir region for providing a track for storing and moving data. The magnetic track 140 has a bit storage region 135. The magnetic track 140 is magnetized into a plurality of magnetic domains, for example, magnetic domains 125 and 130. Directions of magnetization vectors of the magnetic domains can be used to represent logic values of 0 and 1 of the stored data.

In a quiescent state of data storage, i.e. a stable state without supplying a current pulse 145 to drive a domain wall motion (DWM), the bit storage region 135 is not moved (shown in FIG. 1A). When bit data of the bit storage region 135 is sequentially read, the current pulse 145 supplied to the magnetic track 140 may cause a DWM of each of the magnetic domains (for example, the magnetic domains 125 and 130, etc.) along a direction of the electron flow. The reader 120 of the magnetic shift register 100 is connected to the magnetic track 140 through a magnetic tunnel junction (MTJ). During a process of DWM, the reader 120 can read data stored in each of the magnetic domains in the bit storage region 135.

FIG. 1B illustrates a transient state of the magnetic shift register 100 during a process of DWM. The reader 120 can read bit data of the closest magnetic domain. In such transient state, the bit data of the read magnetic domain has been shifted to the right-side magnetic track until all bit data stored in the bit storage region 135 are read, as that shown in FIG. 1C.

When the magnetic shift register 100 writes data, the current pulse 145 is supplied to drive a DWM, so as to move a magnetic domain to be written with data to a place where the writing device 115 locates. In collaboration with a timing of DWM, the writing device 115 moves a stray field of a specific direction to a writing region, so that a magnetic moment of the magnetic domain closest to the writing device 115 is turned over to a target direction. Then, the reversed current pulse 145 is supplied to move back the bit storage region 135 to its original position, as that shown in FIG. 1A.

A main part of the magnetic shift register 100 is the magnetic track 140 including a plurality of magnetic domains, and the magnetic track 140 is generally a magnetic nano line. The material of the magnetic track 140 includes IMA materials and PMA materials. Regarding the IMA material, especially NiFe (permalloy), the current-driven domain wall motion is the most widely studied. However, in the IMA track, since a width of a domain wall is equivalent to a line width, and the domain wall is very sensitive to the magnetic field, a space of the domain walls cannot be too short, or otherwise an attraction or repulsion phenomenon of the domain walls is liable to be generated to cause a magnetic moment variation under a function of the magnetic fields of the domain walls. Generally, the space of the domain walls of the IMA track may be 5 times greater than the line width, so that the IMA track is not suitable for a high-density demand.

Since Ku of the PMA material is quite large, the width of the domain wall is extremely small (which is below 20 nm). The interaction between the domain walls of the PMA track is relatively small, so that the domain walls can be very close to each other. Therefore, a density of the PMA track can be more than 10 times higher compared to that of the IMA track. Besides, according to theoretical calculations or simulations, it is known that the PMA domain wall is less sensitive to a track defect, and a film thickness and the line width can be adjusted to decrease the current for more than 10 times, so that a theoretical DWM characteristic thereof is superior to that of the IMA domain wall. Since the PMA materials have characteristics of high density and requiring a low current to drive the DWM, it becomes a primary selection in materials of the magnetic track 140. In the following embodiments, the PMA materials are used to implement the magnetic track 140.

Figure 2B:
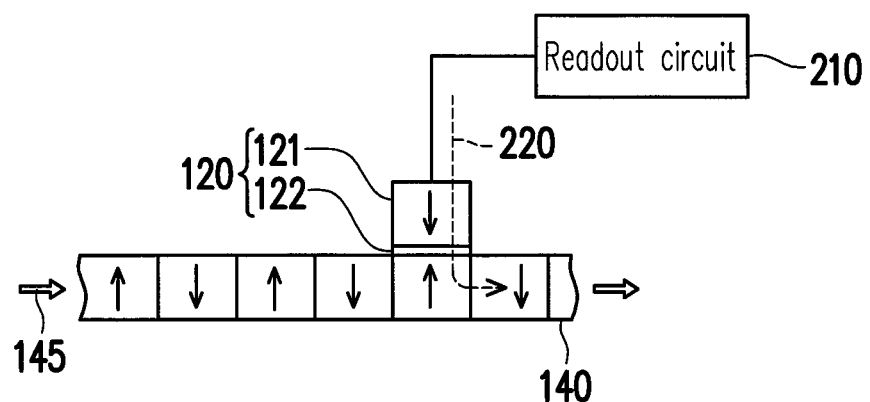

FIGS. 2A-2B are schematic diagrams illustrating operation examples of the reader 120 of FIGS. 1A-1C. Related descriptions of FIGS. 1A-1C can be referred for descriptions of FIGS. 2A-2B. The reader 120 includes a magnetic reference layer 121 and a tunnelling layer 122. The magnetic reference layer 121 is disposed at a first side (for example, an upper side or a lower side) of the magnetic track 140 for providing a first magnetic field having a first direction (for example, a downward direction) to the magnetic track 140. A material of the magnetic reference layer 121 is a ferromagnetic material, for example, a PMA material such as a multilayer material of $(Co/Ni)_x$, $(Co/Pt)_x$ and $(Co/Pd)_x$, etc., or an alloy of CoPt, CoPd, FePt, CO and CoFeB, etc., or a PMA alloy formed by rare-earth such as TbFeCo, etc. and a transition metal, or a PMA composite magnetic layer composed of all of the aforementioned PMA materials and the IMA materials such as CoFe, Co, CoFeB, NiFe, etc. In the present embodiment, the material of the magnetic reference layer 121 is the PMA material.

The tunnelling layer 122 is disposed between the magnetic reference layer 121 and the magnetic track 140 for providing a magnetic tunnel junction (MTJ) between the magnetic reference layer 121 and the magnetic track 140. The tunnelling layer 122 is a non-conductive material with an extremely thin thickness, for example, $AlO_x$ or MgO, etc. Since the thickness of the tunnelling layer 122 is extremely thin, it may have a tunnelling effect to allow electrons tunnelling there through, so that a current 220 can pass through the tunnelling layer 122.

The magnetic reference layer 121 is electrically connected to a readout circuit 210. The readout circuit 210 can obtain a magnetoresistance according to a magnitude of the current 220, and then obtain the bit data of the magnetic domain closest to the reader 120 according to the magnetoresistance. For example, when magnetic moment directions of the magnetic domain closest to the reader 120 and the magnetic reference layer 121 are parallel to each other (shown in FIG. 2A), the generated magnetoresistance is relatively small. When the magnetic moment directions of the magnetic domain closest to the reader 120 and the magnetic reference layer 121 are anti-parallel to each other (shown in FIG. 2B), the generated magnetoresistance is relatively large. Therefore, the magnetic domain of the magnetic track 140 can be used to record digital data of 0 or 1.

However, a stray field of the magnetic reference layer 121 may influence the DWM of the magnetic track 140. As shown in FIG. 2A, magnetic moment directions of a magnetic domain 230 and the magnetic reference layer 121 are anti-parallel to each other, so that a repulsive force exits between the magnetic domain 230 and the magnetic reference layer 121. Such repulsive force may become a resistance when the magnetic domain 230 moves rightwards.

Figure 3A:
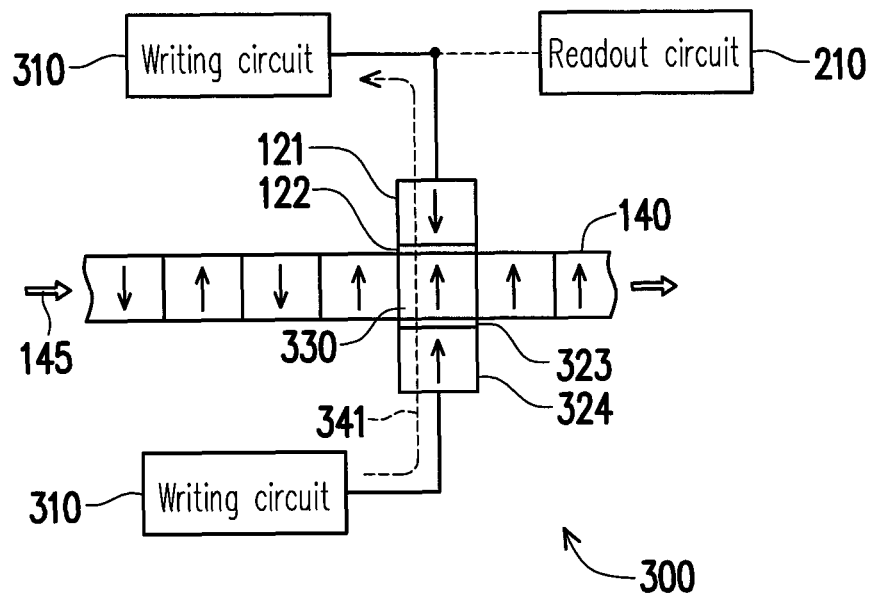
FIGS. 3A-3C are schematic diagrams of a reading device and a writing device of a magnetic shift register.
Figure 3B:
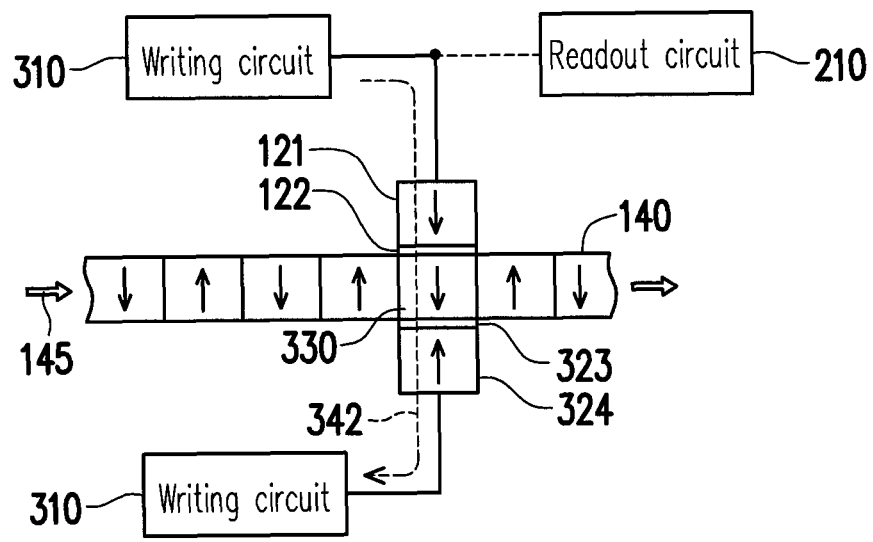
Figure 3C:
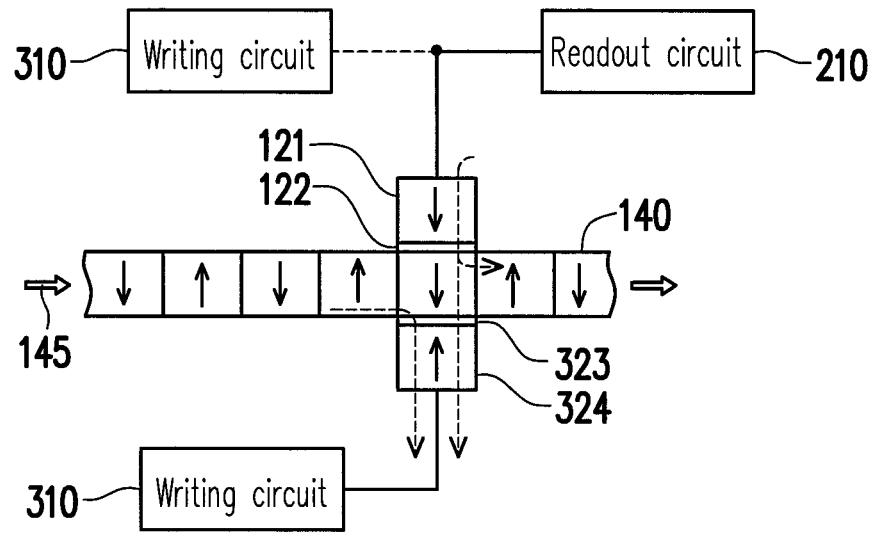

FIGS. 3A-3C are schematic diagrams of a reading device and a writing device of the magnetic shift register 300. Related descriptions of FIGS. 1A-1C and FIGS. 2A-2B can be referred for descriptions of FIGS. 3A-3C. The reading device includes a magnetic reference layer 121, a tunnelling layer 122, a tunnelling layer 323 and a magnetic reference layer 324. Implementations of the tunnelling layer 323 and the magnetic reference layer 324 can refer to the related descriptions of the magnetic reference layer 121 and the tunnelling layer 122 of FIGS. 2A-2B. The magnetic reference layer 121 and the magnetic reference layer 324 are electrically connected to a writing circuit 310. The magnetic reference layer 121 is electrically connected to the readout circuit 210. Under a data writing state, the magnetic reference layer 121 is selectively connected to the writing circuit 310, electrically, as that shown in FIGS. 3A-3B. Under a data reading state, the magnetic reference layer 121 is selectively connected to the readout circuit 210, electrically, as that shown in FIG. 3C.

Under the data writing state, the writing circuit 310 can supply a current to the magnetic reference layer 121, the tunnelling layer 122, the tunnelling layer 323 and the magnetic reference layer 324 to change a magnetic moment direction of a magnetic domain 330. For example, when a direction of an electron flow 341 supplied by the writing circuit 310 is from the magnetic reference layer 324 to the magnetic reference layer 121 through the tunnelling layer 323, the magnetic domain 330 and the tunnelling layer 122 (shown in FIG. 3A), the magnetic moment direction of the magnetic domain 330 is set to be the same as the moment of 324 (upward). When a direction of a an electron flow 342 supplied by the writing circuit 310 is from the magnetic reference layer 121 to the magnetic reference layer 324 through the tunnelling layer 122, the magnetic domain 330 and the tunnelling layer 323 (shown in FIG. 3B), the magnetic moment direction of the magnetic domain 330 is set to be the same as the moment of 121 (downward).

Under the data reading state, the magnetic reference layer 121 is selectively connected to the readout circuit 210, electrically, as that shown in FIG. 3C. Here, a data reading process of the magnetic shift register 300 can refer to related descriptions of FIGS. 2A-2B, which are not repeated. Since the magnetic moment direction of the magnetic reference layer 324 is reversed to the magnetic moment direction of the magnetic reference layer 121, the reversed magnetic moment of the magnetic reference layer 324 can cancel the stray field of the magnetic reference layer 121. Comparatively, the reversed magnetic moment of the magnetic reference layer 121 can cancel the stray field of the magnetic reference layer 324. Therefore, the magnetic reference layer 324 can reduce an influence of the magnetic reference layer 121 on the DWM of the magnetic track 140.

However, referring to FIG. 3C, during a data reading process of the readout circuit 210, since the current in the magnetic track 140 is shunted to the tunnelling layer 323 and the magnetic reference layer 324, the magnetic shift register 300 may increase an operating current, for example, increase a current pulse 145 for driving the DWM and/or increase a reading current of the readout circuit 210.

Figure 4:
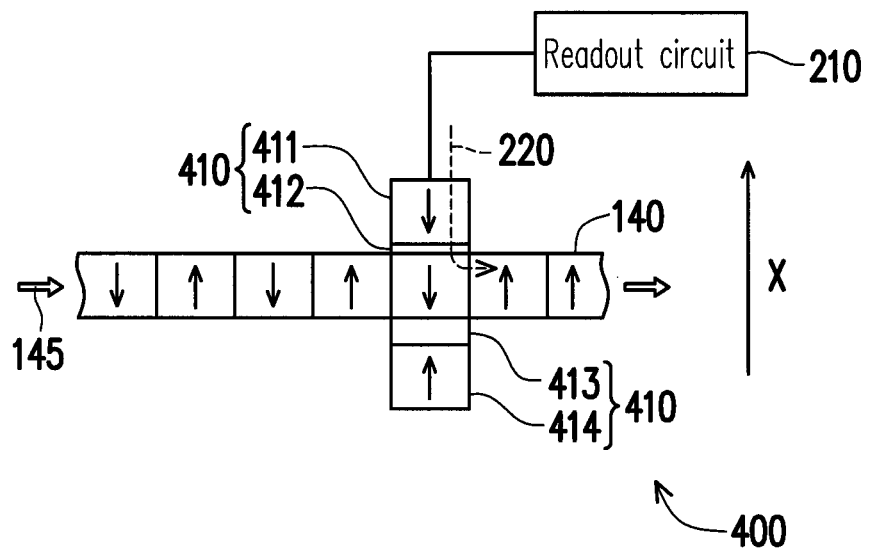
FIG. 4 is a structural schematic diagram of a reader of a magnetic shift register according to an embodiment of the disclosure.

FIG. 4 is a structural schematic diagram of a reader 410 of a magnetic shift register 400 according to an embodiment of the disclosure. Descriptions of FIG. 4 can refer to related descriptions of FIGS. 1A-1C, FIGS. 2A-2B and FIGS. 3A-3C. Referring to FIG. 4, the reader 410 includes a magnetic reference layer 411, a tunnelling layer 412, an isolated layer 413 and a magnetic cancelling layer 414. The magnetic reference layer 411 is disposed at a first side of the magnetic track 140 of the magnetic shift register 400. The magnetic cancelling layer 414 is disposed at a second side (for example, an opposite side of the magnetic reference layer 411) of the magnetic track 140. In the present embodiment, the magnetic reference layer 411 is disposed at the upper side of the magnetic track 140, and the magnetic cancelling layer 414 is disposed at the lower side of the magnetic track 140.

The tunnelling layer 412 is disposed between the magnetic reference layer 411 and the magnetic track 140 for providing a MTJ between the magnetic reference layer 411 and the magnetic track 140. Implementations of the magnetic reference layer 411 and the tunnelling layer 412 and a reading operation process can refer to related descriptions of the magnetic reference layer 121 and the tunnelling layer 122 of FIGS. 2A-2B, which are not repeated.

The magnetic reference layer 411 is electrically connected to the readout circuit 210, and the magnetic cancelling layer 414 is floating. Materials of the magnetic reference layer 411 and the magnetic cancelling layer 414 are PMA materials. The materials of the magnetic reference layer 411 and the magnetic cancelling layer 414 can be the same. In other embodiments, the materials of the magnetic reference layer 411 and the magnetic cancelling layer 414 are can be different. The magnetic reference layer 411 provides a first magnetic field having a first direction to the magnetic track 140, and the magnetic cancelling layer 414 provides a second magnetic field having a second direction to the magnetic track 140, where the second direction is different to the magnetic field direction of the magnetic reference layer 411. For example, the second direction and the first direction have a difference of 180°. In the present embodiment, a magnetic moment direction of the magnetic reference layer 411 is downward, and a magnetic moment direction of the magnetic cancelling layer 414 is upward. Moreover, a magnetic moment of the magnetic reference layer 411 is equal to a magnetic moment of the magnetic cancelling layer 414. In other embodiments, the magnetic moment of the magnetic reference layer 411 is not equal to the magnetic moment of the magnetic cancelling layer 414, for example, the magnetic moment of the magnetic cancelling layer 414 is smaller than the magnetic moment of the magnetic reference layer 411, or the magnetic moment of the magnetic cancelling layer 414 is greater than the magnetic moment of the magnetic reference layer 411. A difference of the magnetic moments of the magnetic cancelling layer 414 and the magnetic reference layer 411 can be determined according to an actual design requirement, for example, the difference is smaller than 10 gauss. Since the magnetic moment direction of the magnetic cancelling layer 414 and the magnetic moment direction of the magnetic reference layer 411 are anti-parallel, the reversed magnetic moment of the magnetic cancelling layer 414 can cancel the stray field of the magnetic reference layer 411. Therefore, the magnetic cancelling layer 414 can reduce an influence of the magnetic reference layer 411 on the DWM of the magnetic track 140.

The isolated layer 413 is disposed between the magnetic cancelling layer 414 and the magnetic track 140. The isolated layer 413 is made of a non-conductive material with a relatively thick thickness or a high-resistance thin film, for example, $SiO_2$, $AlO_x$ or MgO, etc. In the present embodiment, the thickness of the isolated layer 413 is greater than 30 Å. Since the thickness of the isolated layer 413 is thick enough, the isolated layer 413 can block the current (or electron flow) in the magnetic track 140 from tunnelling to the magnetic cancelling layer 414. Namely, the thickness of the isolated layer 413 is thick enough to avoid occurrence of a tunnelling effect. Therefore, the reader 410 of FIG. 4 mitigates the shortage of current shunting caused by the tunnelling layer 323 and the magnetic reference layer 324 as that shown in FIG. 3C. On the other hand, since the isolated layer 413 requires a thick thickness, a required process tolerance space or an error tolerance is relatively large, and during a manufacturing process, a chemical mechanical polish (CMP) process can be used to adjust the thickness of the isolated layer 413 to reduce the manufacturing cost. For comparison, the tunnelling layer of FIGS. 3A-3C is very thin, which is of no avail for processing control and production yield.

Figure 5:
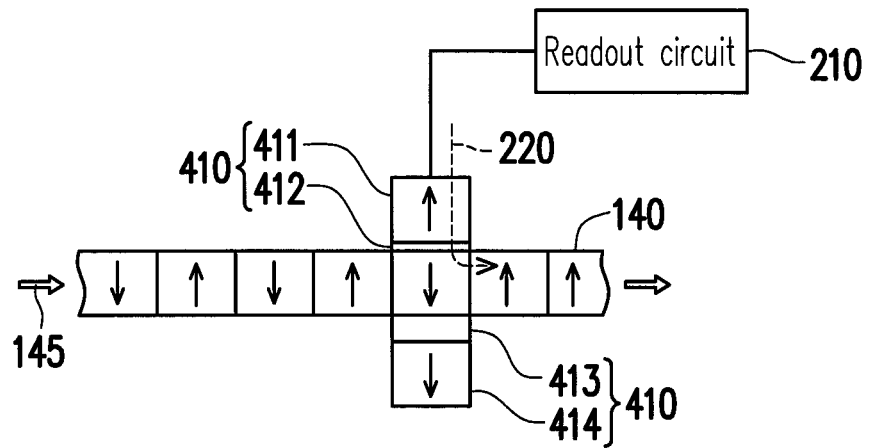
FIG. 5 is a structural schematic diagram of a reader according to another embodiment of the disclosure.

FIG. 5 is a structural schematic diagram of the reader 410 according to another embodiment of the disclosure. Descriptions of FIG. 5 can refer to the related descriptions of FIG. 4, and a difference there between is that the magnetic moment direction of the magnetic reference layer 411 of FIG. 5 is upward, and the magnetic moment direction of the magnetic cancelling layer 414 is downward.

Figure 6:
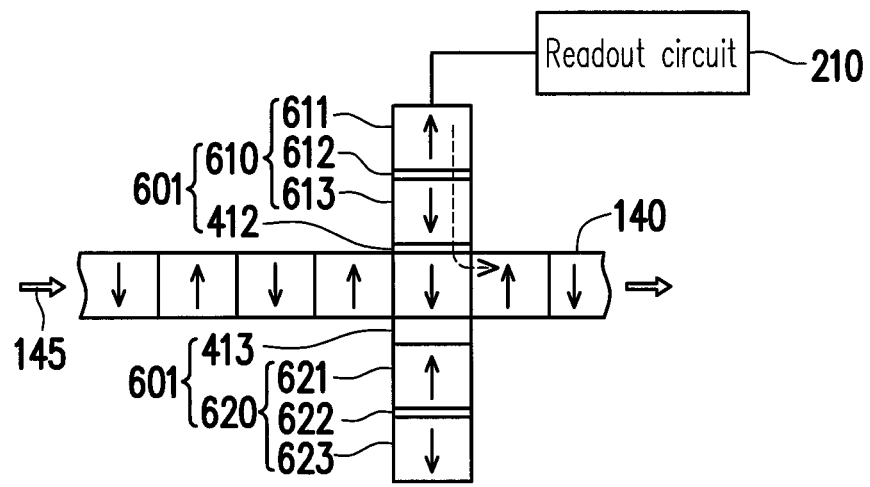
FIG. 6 is a structural schematic diagram of a reader according to still another embodiment of the disclosure.

FIG. 6 is a structural schematic diagram of a reader 601 according to still another embodiment of the disclosure. The reader 601 includes a magnetic reference layer 610, the tunnelling layer 412, the isolated layer 413 and a magnetic cancelling layer 620. Descriptions of FIG. 6 can refer to the related descriptions of FIG. 4, and a difference there between is that the magnetic reference layer 610 and the magnetic cancelling layer 620 of FIG. 6 are synthetic ant-ferromagnetic (SAF) structures.

Referring to FIG. 6, the magnetic reference layer 610 includes a ferromagnetic layer 611, a non-magnetic metal layer 612 and a ferromagnetic layer 613. The magnetic moments of 611 and 613 are anti-parallel. Similarly, the magnetic cancelling layer 620 includes a ferromagnetic layer 621, a non-magnetic metal layer 622 and a ferromagnetic layer 623. The magnetic moments of 621 and 623 are anti-parallel. The ferromagnetic layer 611 is electrically connected to the readout circuit 210. The ferromagnetic layer 621, the non-magnetic metal layer 622 and the ferromagnetic layer 623 are floating. Materials of the ferromagnetic layers 611, 613, 621 and 623 of FIG. 6 can be PMA materials such as multi-layer materials of (Co/Ni)x, (Co/Pt)x and (Co/Pd)x, etc., or alloys of CoPt, CoPd, FePt, CO and CoFeB, etc., or PMA alloys formed by rare-earth such as TbFeCo, etc. and a transition metal, or PMA composite magnetic layers composed of all of the aforementioned PMA materials and the IMA materials such as CoFe, Co, CoFeB, NiFe, etc. Materials of the non-magnetic metal layer 612 and 622 can be Ru, Cu or other non-magnetic metal materials.

In summary, the magnetic moments of the magnetic reference layer and the magnetic cancelling layer are anti-parallel to each other. The reader uses the magnetic moment of the magnetic cancelling layer to cancel the stray field of the magnetic reference layer, by which an influence of the stray field of the magnetic reference layer on the domain wall motion in the magnetic track is reduced.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A reader for a magnetic shift register, comprising:
   a magnetic reference layer, disposed at a first side of a magnetic track of the magnetic shift register as a magnetic pinned layer, for providing a first magnetic field having a first direction to the magnetic track, wherein the magnetic reference layer is electrically connected to a readout circuit;
   a tunneling layer, disposed between the magnetic reference layer and the magnetic track, for providing a magnetic tunnel junction between the magnetic reference layer and the magnetic track;
   a magnetic cancelling layer, disposed at a second side of the magnetic track, partially or completely overlapped to the magnetic reference layer in a perpendicular direction of the magnetic track, and providing a second magnetic field having a second direction to the magnetic track, wherein the second direction is opposite to the first direction, and the magnetic cancelling layer is floating; and
   an isolated layer, disposed between the magnetic cancelling layer and the magnetic track, for blocking a current in the magnetic track from tunneling to the magnetic cancelling layer,
   wherein the magnetic cancelling layer is synthetic anti-ferromagnetic structures, and the synthetic anti-ferromagnetic structure of the magnetic cancelling layer comprises:
   a third ferromagnetic layer, disposed at the second side of the magnetic track and the isolated layer, wherein the third ferromagnetic layer is floating, and a magnetic moment direction of the third ferromagnetic layer is the second direction;
   a second non-magnetic metal layer, disposed between the third ferromagnetic layer and the fourth ferromagnetic layer; and
   a fourth ferromagnetic layer, disposed between the isolated layer and the second non-magnetic metal layer, and a magnetic moment direction of the fourth ferromagnetic layer is the first direction.

2. The reader for the magnetic shift register as claimed in claim 1, wherein the magnetic track, the magnetic reference layer and the magnetic cancelling layer are perpendicular magnetic anisotropy materials.

3. The reader for the magnetic shift register as claimed in claim 1, wherein the first side is an upper side of the magnetic track, and the second side is a lower side of the magnetic track.

4. The reader for the magnetic shift register as claimed in claim 1, wherein the magnetic reference layer is synthetic anti-ferromagnetic structures.

5. The reader for the magnetic shift register as claimed in claim 4, wherein the synthetic anti-ferromagnetic structure of the magnetic reference layer comprises:
   a first ferromagnetic layer, disposed at the first side of the magnetic track and the tunneling layer, and electrically connected to the readout circuit, wherein a magnetic moment direction of the first ferromagnetic layer is the first direction;
   a first non-magnetic metal layer, disposed between the first ferromagnetic layer and the second ferromagnetic layer; and
   a second ferromagnetic layer, disposed on the first non-magnetic metal layer, wherein a magnetic moment direction of the second ferromagnetic layer is the second direction.

* * * * *